(12) United States Patent
Wang et al.

(10) Patent No.: US 12,033,882 B2
(45) Date of Patent: Jul. 9, 2024

(54) MICRO-LED TRANSFER METHOD AND DISPLAY PANEL

(71) Applicant: BOE TECHNOLOGY GROUP CO., LTD., Beijing (CN)

(72) Inventors: Lili Wang, Beijing (CN); Chuhang Wang, Beijing (CN); Chao Liu, Beijing (CN); Qiangwei Cui, Beijing (CN); Ke Meng, Beijing (CN); Linhui Gong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 564 days.

(21) Appl. No.: 17/295,036

(22) PCT Filed: May 9, 2020

(86) PCT No.: PCT/CN2020/089373
§ 371 (c)(1),
(2) Date: May 18, 2021

(87) PCT Pub. No.: WO2020/248750
PCT Pub. Date: Dec. 17, 2020

(65) Prior Publication Data
US 2022/0013398 A1    Jan. 13, 2022

(30) Foreign Application Priority Data
Jun. 10, 2019 (CN) .......................... 201910497258.X

(51) Int. Cl.
H01L 21/683 (2006.01)
H01L 25/075 (2006.01)
H01L 33/62 (2010.01)

(52) U.S. Cl.
CPC ...... *H01L 21/6835* (2013.01); *H01L 25/0753* (2013.01); *H01L 33/62* (2013.01);
(Continued)

(58) Field of Classification Search
CPC . H01L 2221/68381; H01L 2221/68354; H01L 2221/68368; H01L 21/6835; H01L 2221/683–68336
See application file for complete search history.

(56) References Cited

U.S. PATENT DOCUMENTS 7,244,326 B2 *  7/2007  Craig ................. H01L 21/6835
                                              257/E23.179
10,211,363 B2   2/2019  Chen
(Continued)

FOREIGN PATENT DOCUMENTS

CN  106903978 A    6/2017
CN  108231653 A  * 6/2018  ......... H01L 21/6835
(Continued)

OTHER PUBLICATIONS

The Fascinating World of Solder Alloys and Metallurgy; Posch, Maya; May 2019; URL:https://hackaday.com/2019/05/30/the-fascinating-world-of-solder-alloys-and-metallurgy/ (Year: 2019).*
(Continued)

*Primary Examiner* — Steven M Christopher
*Assistant Examiner* — Tyler J Wiegand
(74) *Attorney, Agent, or Firm* — Chiwin Law LLC

(57) ABSTRACT

A micro-LED transfer method, including: moving a passing substrate to a position above a donor substrate and moving the pasting substrate in a direction approaching the donor substrate to paste up LED grains so that the LED grains are separated from the bearing substrate; moving the pasting substrate with the LED grains to a position above a target substrate with the LED grains being closer to the target substrate than the pasting substrate, and conducting an alignment so that the LED grains are directly opposite to positions on the target substrate where the LED grains are to be arranged; and heating the pasting substrate with the LED grains to a first temperature greater than or equal to a melting
(Continued)

temperature of the hot melt adhesive film to melt the hot melt adhesive film, so that the LED grains are separated from the pasting substrate and transferred to the target substrate.

16 Claims, 6 Drawing Sheets

(52) U.S. Cl.
CPC ............... *H01L 2221/68354* (2013.01); *H01L 2221/68368* (2013.01); *H01L 2933/0066* (2013.01)

(56) References Cited

U.S. PATENT DOCUMENTS

| | | | |
|---|---|---|---|
| 2014/0312368 A1* | 10/2014 | Lee | ............... H01L 27/156 257/89 |
| 2019/0326143 A1 | 10/2019 | Lai et al. | |
| 2021/0074689 A1 | 3/2021 | Mai et al. | |

FOREIGN PATENT DOCUMENTS

| | | |
|---|---|---|
| CN | 108231653 A | 6/2018 |
| CN | 109285923 A | 1/2019 |
| CN | 109728022 A | 5/2019 |
| CN | 110183979 A | 8/2019 |
| CN | 110190014 A | 8/2019 |
| CN | 110416139 A | 11/2019 |
| CN | 110534627 A | 12/2019 |
| KR | 20150145305 A | 12/2015 |
| TW | I659486 A | 5/2019 |

OTHER PUBLICATIONS

"Deep Dive Into the Benefits of Using Silicone Rubber"; Newtop; Jun. 2023; URL:https://www.newtopcustomsilicone.com/deep-dive-into-the-benefits-of-using-silicone-rubber-and-its-melting-point/#:~:text=Generally%2C%20silicone%20rubber%20melts%20between,oil%2C%20water%2C%20and%20chemic (Year: 2023).*
"Special Issue "Applications of Spray Coating in Fabrication of Thin Film Devices and Coatings""; Eslamian, Morteza; May 2017; URL: https://www.mdpi.com/journal/coatings/special_issues/spray_coating (Year: 2017).*

* cited by examiner

MICRO-LED TRANSFER METHOD AND DISPLAY PANEL

CROSS-REFERENCE TO RELATED APPLICATIONS

This application is a U.S. National Phase Entry of International Application No. PCT/CN2020/089373 filed on May 9, 2020, designating the United States of America and claiming priority to Chinese Patent Application No. 201910497258.X filed on Jun. 10, 2019. The present application claims priority to and the benefit of the above-identified applications and the above-identified applications are incorporated by reference herein in their entirety.

TECHNICAL FIELD

Embodiments of the present disclosure relate to a micro-LED transfer method and display panel.

BACKGROUND

Currently, Micro-Light-Emitting Diode (Micro-LED) display devices have become the most promising, next-generation new display technology for advantages such as independent pixel control, self-illumination, high brightness, wide color gamut, stable material performance and long service life.

The existing manufacturing process of Micro-LED display devices involve many problems to be solved, for example, how to transfer miniaturized, high-density and arrayed LED grains to a circuit substrate.

SUMMARY

Embodiments of the present disclosure provide a micro-LED transfer method and a display panel, which can achieve transferring LED grains and meanwhile reducing or eliminating a height difference between the LED grains and a target substrate.

Embodiments of the present disclosure provide a micro-light-emitting diode (micro-LED) transfer method, including: providing a donor substrate, the donor substrate including a bearing substrate and a plurality of LED grains arranged on the bearing substrate in an array; providing a pasting substrate, the pasting substrate including a bottom plate and a hot melt adhesive film arranged on the bottom plate; moving the pasting substrate to a position above the donor substrate, and moving the pasting substrate in a direction approaching the donor substrate to paste up the plurality of LED grains arranged on the bearing substrate by using the pasting substrate, so that the plurality of LED grains are separated from the bearing substrate; moving the pasting substrate pasted with the plurality of LED grains to a position above a target substrate in such a manner that the plurality of LED grains are closer to the target substrate than the pasting substrate, and conducting an alignment so that the plurality of LED grains are directly opposite to positions on the target substrate where the plurality of LED grains are to be arranged, respectively; and heating the pasting substrate pasted with the plurality of LED grains to a first temperature to melt the hot melt adhesive film, so that the plurality of LED grains are separated from the pasting substrate and then are transferred to the target substrate, the first temperature being greater than or equal to a melting temperature of the hot melt adhesive film.

In the micro-LED transfer method provided by some embodiments of the present disclosure, the bottom plate includes a plurality of through-holes covered by the hot melt adhesive film.

In the micro-LED transfer method provided by some embodiments of the present disclosure, moving the pasting substrate to the position above the donor substrate, and moving the pasting substrate in the direction approaching the donor substrate to paste up the plurality of LED grains arranged on the bearing substrate by using the pasting substrate includes: moving the pasting substrate to the position above the donor substrate, conducting an alignment so that the plurality of LED grains are directly opposite to the plurality of through-holes in the bottom plate, respectively, and moving the pasting substrate in the direction approaching the donor substrate to paste up the plurality of LED grains arranged on the bearing substrate by using the pasting substrate.

In the micro-LED transfer method provided by some embodiments of the present disclosure, a size of each of the plurality of through-holes in a direction parallel to the bearing substrate is greater than a size of each of the plurality of LED grains in the direction parallel to the bearing substrate.

In the micro-LED transfer method provided by some embodiments of the present disclosure, moving the pasting substrate to the position above the donor substrate includes: moving the pasting substrate to the position above the donor substrate in such a manner that the bottom plate is closer to the plurality of LED grains than the hot melt adhesive film.

In the micro-LED transfer method provided by some embodiments of the present disclosure, a thickness of the bottom plate in a direction perpendicular to the bearing substrate is smaller than a thickness of each of the plurality of LED grains in the direction perpendicular to the bearing substrate.

In the micro-LED transfer method provided by some embodiments of the present disclosure, electrically conductive adhesives are arranged at positions on the target substrate where the plurality of LED grains are to be arranged; after the plurality of LED grains are directly opposite to the positions on the target substrate where the plurality of LED grains are to be arranged, and before the pasting substrate pasted with the plurality of LED grains is heated to the first temperature, the micro-LED transfer method further includes: pressing the pasting substrate pasted with the plurality of LED grains against the target substrate so as to connect electrodes of the plurality of LED grains to the electrically conductive adhesives on the target substrate, respectively.

In the micro-LED transfer method provided by some embodiments of the present disclosure, after the plurality of LED grains are transferred to the target substrate, the micro-LED transfer method further includes: heating the target substrate to a second temperature, the second temperature being greater than or equal to a melting temperature of the electrically conductive adhesives.

In the micro-LED transfer method provided by some embodiments of the present disclosure, the second temperature is greater than the first temperature.

In the micro-LED transfer method provided by some embodiments of the present disclosure, the electrically conductive adhesives include tin pastes.

In the micro-LED transfer method provided by some embodiments of the present disclosure, after heating the target substrate to the second temperature, the micro-LED transfer method further includes: cooling the target substrate so as to solidify a hot melt adhesive flowing between adjacent LED grains.

In the micro-LED transfer method provided by some embodiments of the present disclosure, after the plurality of LED grains are transferred to the target substrate, the micro-LED transfer method further includes: forming a transparent protective film on sides of the plurality of LED grains that are away from the target substrate.

In the micro-LED transfer method provided by some embodiments of the present disclosure, forming the transparent protective film on the sides of the plurality of LED grains that are away from the target substrate includes: forming the transparent protective film on the sides of the plurality of LED grains that are away from the target substrate by using an atomization spraying process.

In the micro-LED transfer method provided by some embodiments of the present disclosure, a size of the protective film in a direction perpendicular to the target substrate is smaller than a size of the hot melt adhesive film in the direction perpendicular to the target substrate.

In the micro-LED transfer method provided by some embodiments of the present disclosure, a size of each of the plurality of LED grains in a direction perpendicular to the target substrate is greater than or equal to a size of the hot melt adhesive film in the direction perpendicular to the target substrate.

In the micro-LED transfer method provided by some embodiments of the present disclosure, the hot melt adhesive film is an insulating material film.

In the micro-LED transfer method provided by some embodiments of the present disclosure, the target substrate is a circuit substrate.

At least some embodiments of the present disclosure further provide a display panel, including: a target substrate; and a plurality of micro-LED grains arranged on the target substrate; a hot melt adhesive film is filled between adjacent micro-LED grains.

In the display panel provided by some embodiments of the present disclosure, a size of each of the plurality of micro-LED grains in a direction perpendicular to the target substrate is greater than or equal to a size of the hot melt adhesive film in the direction perpendicular to the target substrate.

In the display panel provided by some embodiments of the present disclosure, the hot melt adhesive film is a thermoplastic adhesive film.

In the display panel provided by some embodiments of the present disclosure, the display panel further includes: a protective film arranged on sides of the plurality of micro-LED grains that are away from the target substrate, wherein a size of the protective film in a direction perpendicular to the target substrate is smaller than a size of the hot melt adhesive film in the direction perpendicular to the target substrate.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure without construing any limitation thereto.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
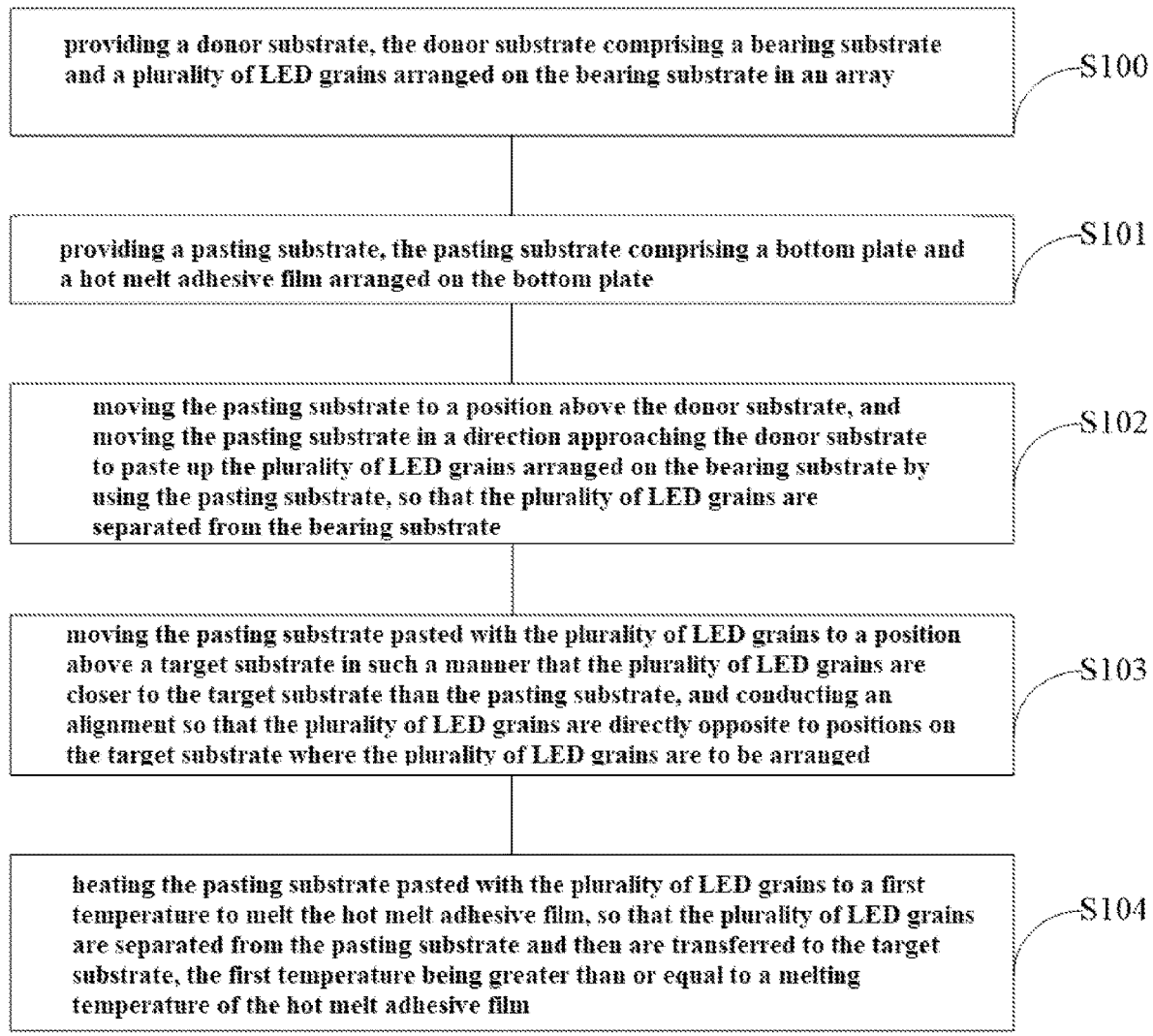
FIG. 1 is a flow chart of a micro-LED transfer method provided by an embodiment of the present disclosure.

The embodiments of the present disclosure provide a micro-LED transfer method. As shown in FIG. 1, this method includes the following steps S100-S104. The steps are each explained in detail below.

Figure 2:
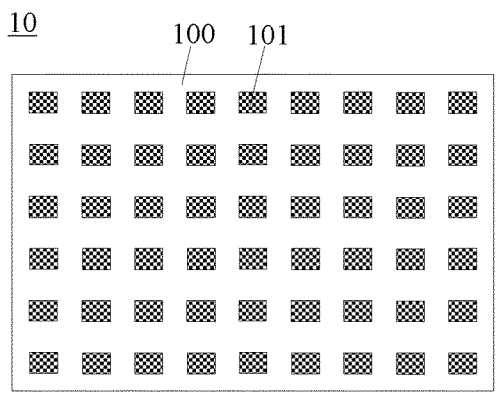
FIG. 2 is a structural diagram of a donor substrate provided by an embodiment of the present disclosure.

S100: As shown in FIG. 2, a donor substrate 10 is provided. The donor substrate 10 includes a bearing substrate 100 and a plurality of LED grains 101 arranged on the bearing substrate 100 in an array.

For example, the LED grains 101 mentioned in the embodiments of the present disclosure refer to micro-LED (also referred to as μ-LED) grains. The micro-LED grain is micron-sized, the normal LED grain is millimeter-sized, and the size of the micro-LED grain is reduced to about one percent of that of the normal LED grain.

Figure 3:
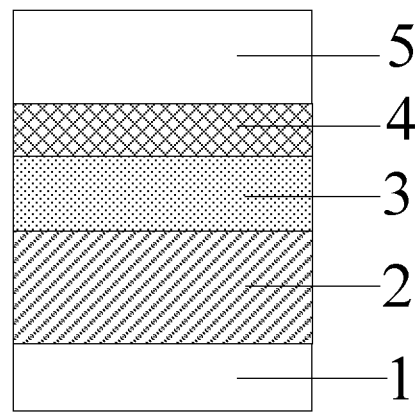
FIG. 3 is a structural diagram of an LED grain provided by an embodiment of the present disclosure.

The structure of the LED grain 101 is not defined in the embodiments of the present disclosure. In some embodiments, as shown in FIG. 3, the LED grains 101 each include a first electrode 1, an n-type semiconductor pattern 2, a light-emitting pattern 3, a p-type semiconductor pattern 4 and a second electrode 5 that are stacked in sequence.

For example, the manufacturing process of the plurality of LED grains 101 is as follows: firstly, an n-type semiconductor layer, a light-emitting layer and a p-type semiconductor layer are grown in sequence on a substrate (for example, the substrate may be a sapphire substrate, a silicon substrate or a gallium nitride substrate); after that, the n-type semiconductor layer, the light-emitting layer and the p-type semiconductor layer are etched to form a plurality of n-type semiconductor patterns 2, light-emitting patterns 3 and p-type semiconductor patterns 4 that are stacked; then, first electrodes 1 in contact with the n-type semiconductor patterns 2 and second electrodes 5 in contact with the p-type semiconductor patterns are formed, such that a plurality of LED grains 101 are formed on the substrate. Certainly, the plurality of LED grains 101 may also be manufactured by any other suitable methods.

For example, in some embodiments, the bearing substrate 100 and the substrate on which the above-mentioned n-type semiconductor layer, light-emitting layer and p-type semiconductor layer are grown are different substrates. After the plurality of LED grains 101 are grown on the substrate, the substrate may be processed (for example, irradiating the substrate with laser so as to separate the substrate from the LED grains, or cutting the substrate, etc.) to obtain a plurality of LED grains 101 not connected with each other; then the plurality of LED grains 101 are transferred to the bearing substrate 100, and the LED grains 101 are arranged on the bearing substrate 100 in an array. In some other embodiments, the bearing substrate 100 in the embodiments of the present disclosure is just the above-mentioned substrate on which the n-type semiconductor layer, the light-emitting layer and the p-type semiconductor layer are grown.

It should be understood that the bearing substrate 100 and the LED grains 101 in the donor substrate 10 provided by the embodiments of the present disclosure are not connected with each other. In this manner, when the LED grains 101 on the bearing substrate 100 are pasted up by the pasting substrate described later, the LED grains 101 will be separated from the bearing substrate 100. When the bearing substrate 100 is just the above-mentioned substrate on which the n-type semiconductor layer, the light-emitting layer and the p-type semiconductor layer are grown, the substrate should be processed (for example, irradiating the substrate with laser), such that the substrate and the LED grains 101 are not connected with each other.

For example, in some embodiments, an automated optical inspection (AOI) may be utilized to inspect the arrangement of the plurality of LED grains 101, such that the plurality of LED grains 101 are arranged regularly so as to improve the quality of the subsequent transfer operation.

For example, the arrangement manner and spaced distance of the plurality of LED grains 101 on the bearing substrate 100 may be set according to the arrangement manner and spaced distance of the positions on the target substrate 30 (described later) where the LED grains 101 are to be arranged.

Figure 4:
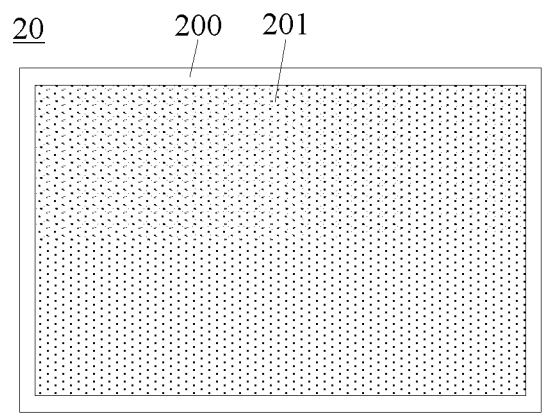
FIG. 4 is a structural diagram of a pasting substrate provided by an embodiment of the present disclosure.
Figure 5:
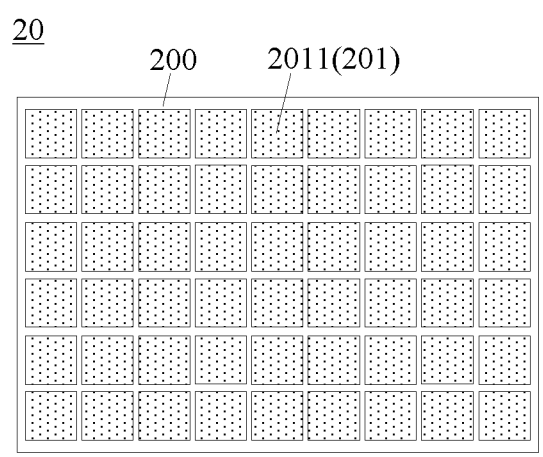
FIG. 5 is a structural diagram of a pasting substrate provided by an embodiment of the present disclosure.

S101: As shown in FIGS. 4 and 5, a pasting substrate 20 is provided. The pasting substrate 20 includes a bottom plate 200 and a hot melt adhesive film 201 arranged on the bottom plate 200.

In some embodiments, the hot melt adhesive film 201 is a thermoplastic adhesive film.

For example, the hot melt adhesive film 201 may be a whole layer, as shown in FIG. 4. The hot melt adhesive film 201 may also include a plurality of hot melt adhesive patterns 2011 arranged in an array, as shown in FIG. 5. In the case where the hot melt adhesive film 201 includes a plurality of hot melt adhesive patterns 2011 arranged in an array, one LED grain 101 is enabled to be directly opposite to one hot melt adhesive pattern 2011 when the pasting substrate 20 is directly opposite to the donor substrate 10.

In the transfer method provided by the embodiments of the present disclosure, the thickness of the hot melt adhesive film 201 is not defined and can be set accordingly based on requirements.

The hot melt adhesive film 201 will be melted when the heating temperature is greater than the melting temperature of the hot melt adhesive film 201.

Figure 6A:
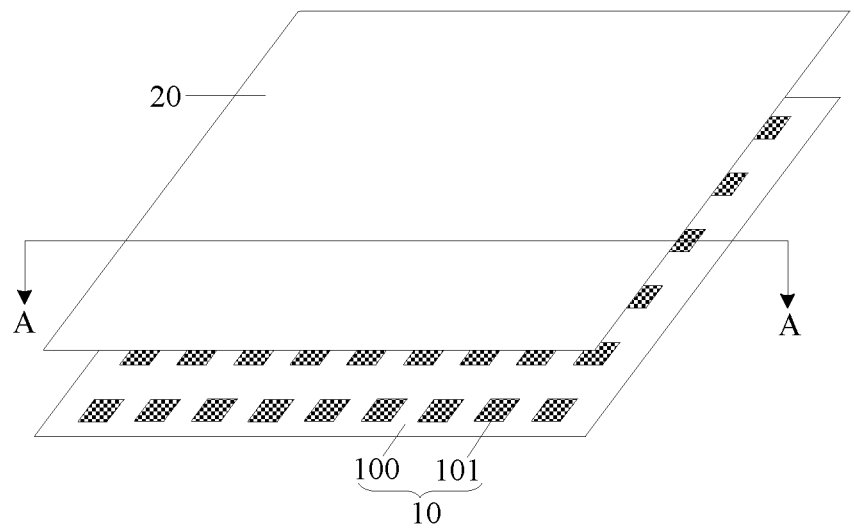
FIG. 6A is a structural diagram illustrating pasting up LED grains arranged on a bearing substrate by using a pasting substrate, according to an embodiment of the present disclosure.
Figure 6B:
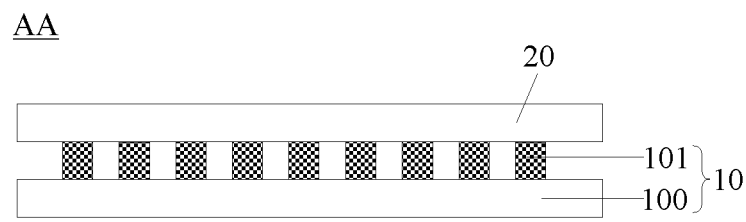
FIG. 6B is a cross-sectional view of FIG. 6A taken along line AA.

S102: As shown in FIGS. 6a and 6b, the pasting substrate 20 is moved to a position above the donor substrate 10, and the pasting substrate 20 is moved in a direction approaching the donor substrate 10; the LED grains 101 on the bearing substrate 100 are pasted up by the pasting substrate 20 so as to separate the LED grains 101 from the bearing substrate 100.

In the embodiments of the present disclosure, the bearing substrate 100 and the LED grains 101 are not connected with each other and are separable, such that after the LED grains 101 on the bearing substrate 100 are pasted up by the pasting substrate 20, the bearing substrate 100 will be separated from the LED grains 101 by moving the pasting substrate 20.

For example, when the LED grains 101 on the donor substrate 10 are pasted up by the pasting substrate 20, the hot melt adhesive film 201 in the pasting substrate 20 may be in contact with the LED grains 101.

Figure 7A:
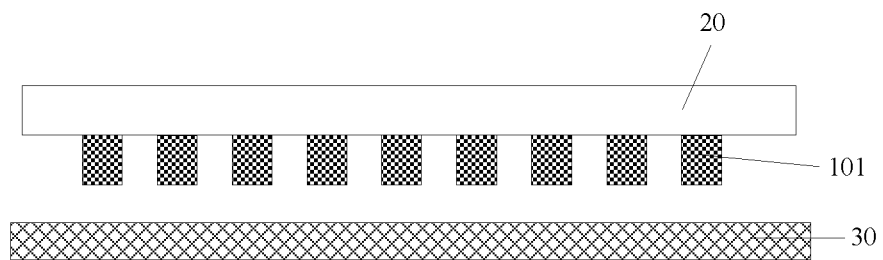
FIG. 7A is a first structural diagram illustrating that a pasting substrate pasted with LED grains is directly opposite to a target substrate, according to an embodiment of the present disclosure.
Figure 7B:
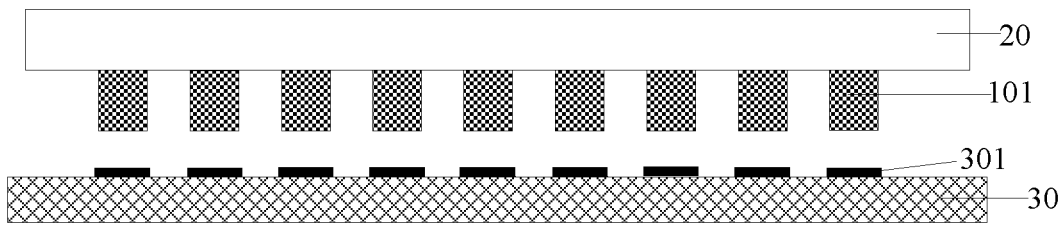
FIG. 7B is a second structural diagram illustrating that a pasting substrate pasted with LED grains is directly opposite to a target substrate, according to an embodiment of the present disclosure.

S103: As shown in FIGS. 7a and 7b, the pasting substrate 20 pasted with the plurality of LED grains 101 is moved to a position above the target substrate 30, and the LED grains 101 are closer to the target substrate 30 than the pasting substrate 20; then an alignment is conducted such that the LED grains 101 are directly opposite to the positions on the target substrate 30 where the LED grains 101 are to be arranged.

In the embodiments of the present disclosure, the target substrate 30 is not defined, and can be selected accordingly based on requirements. In some embodiments, as shown in FIG. 7b, the target substrate 30 is a circuit substrate.

As shown in FIG. 7b, in the case where the target substrate 30 is a circuit substrate, the circuit substrate includes a plurality of driving electrode pairs, and each driving electrode pair includes two driving electrodes 301. Since one LED grain 101 is electrically connected to one driving electrode pair, the positions on the target substrate 30 where the LED grains 101 are to be arranged are the positions where the driving electrode pairs are arranged. The LED grains 101 are directly opposite to the positions on the target substrate 30 where the LED grains 101 are to be arranged. In other words, the LED grains 101 are directly opposite to the driving electrode pairs on the target substrate 30.

For example, the target substrate 30 includes a plurality of positions where the LED grains 101 are to be arranged, and one position where an LED grain 101 is to be arranged is configured to accommodate one LED grain 101.

Figure 8A:
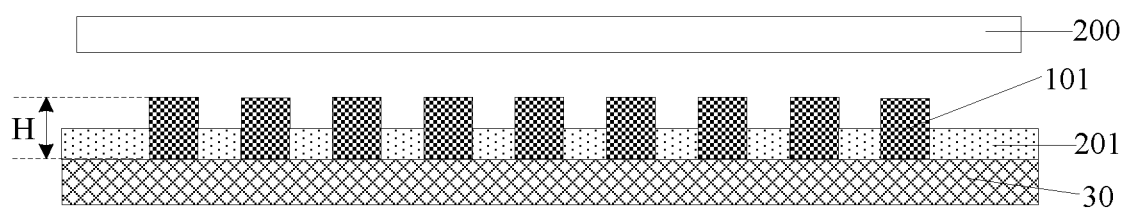
FIG. 8A is a structural diagram in a side view of a target substrate with LED grains transferred thereto, according to an embodiment of the present disclosure.
Figure 8B:
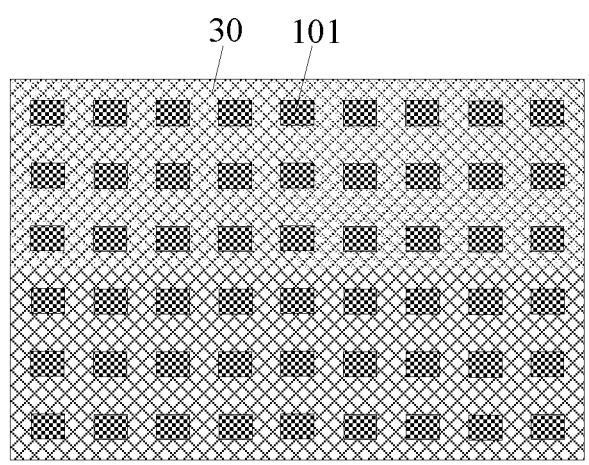
FIG. 8B is a structural diagram in a top view of a target substrate with LED grains transferred thereto, according to an embodiment of the present disclosure.

S104: As shown in FIG. 8a, the pasting substrate 20 pasted with the plurality of LED grains 101 is heated to a first temperature to melt the hot melt adhesive film 201, such that the LED grains 101 are separated from the pasting substrate 20, and as shown in FIGS. 8a and 8b, the LED grains 101 are transferred to the target substrate 30; the first temperature is greater than or equal to the melting temperature of the hot melt adhesive film 201.

For example, after the LED grains 101 are separated from the pasting substrate 20 and transferred to the target substrate 30, the pasting substrate 20 should be removed and subjected to a treatment such as cleaning. Moreover, the pasting substrate 20 may be cleaned by ultrasonic waves so as to remove the hot melt adhesive film 201 remaining on the bottom plate 200.

After the pasting substrate 20 is heated to the first temperature, since the first temperature is greater than or equal to the melting temperature of the hot melt adhesive film 201, the hot melt adhesive film 201 will be melted such that the LED grains 101 are separated from the pasting substrate 20. Since the LED grains 101 are directly opposite to the positions on the target substrate 30 where the LED grains 101 are to be arranged, after the LED grains 101 are separated from the pasting substrate 20, the LED grains 101 will be transferred to the positions on the target substrate 30 where the LED grains 101 are to be arranged.

In some embodiments, after the alignment is conducted, the pasting substrate 20 pasted with the plurality of LED grains 101 and the target substrate 30 may be placed into a heating furnace to be heated to the first temperature.

For example, in the case where the pasting substrate 20 is smaller in size than the target substrate 30, the steps S102-S104 may be repeated to transfer a plurality of LED grains 101 to the target substrate 30. Alternatively, a plurality of pasting substrates 20 may be aligned with the target substrate 30 firstly and then heated to the first temperature.

In the case where the target substrate 30 is a circuit substrate, after the LED grains 101 are transferred to the circuit substrate, the first electrode 1 and the second electrode 5 of each LED grain 101 are electrically connected to two driving electrodes 301 in each driving electrode pair on the circuit substrate, respectively. For example, the plurality of LED grains 101 are transferred to the circuit substrate, such that a micro-LED display device is made.

For example, referring to FIG. 8a, after the LED grains 101 are transferred to the target substrate 30, a height difference H is existed between the LED grains 101 and the target substrate 30, and the height difference has an impact on displaying effect, luminous efficiency and the like. In the embodiments of the present disclosure, after the hot melt adhesive film 201 is melted, the LED grains 101 are separated from the pasting substrate 20 and transferred to the target substrate 30. At the same time, referring to FIG. 8a, after the hot melt adhesive film 201 is melted, the hot melt adhesive will flow into the gaps between adjacent LED grains 101 to fill the height difference, thereby reducing or eliminating the effect of height difference between the LED grains 101 and the target substrate 30. The melted hot melt adhesive film 201 is not shown in FIG. 8b. For example, the hot melt adhesive film 201 is an insulating material film, thereby avoiding affecting the circuit structure.

Based on the above, in the case where the melted hot melt adhesive film 201 is utilized to fill the height difference between the LED grains 101 and the target substrate 30, the thickness of the hot melt adhesive film 201 may be determined according to the size of the height difference.

In the related art, a method in which LED grains 101 are sucked and pressed one by one is adopted to transfer a mass amount of LED grains to a target substrate 30 one by one. As the number of the LED grains is great, the mass transfer involves great difficulties.

The micro-LED transfer method provided by the embodiments of the present disclosure provides a donor substrate 10 and a pasting substrate 20. The donor substrate 10 includes a bearing substrate 100 and a plurality of LED grains 101 arranged on the bearing substrate 100 in an array, and the pasting substrate 20 includes a bottom plate 200 and a hot melt adhesive film 201 arranged on the bottom plate 200. The pasting substrate 20 is moved to a position above the donor substrate 10, and the pasting substrate 20 is moved in a direction approaching the donor substrate 10; the LED grains 101 on the bearing substrate 100 are pasted up by the pasting substrate 20 so as to separate the LED grains 101 from the bearing substrate 100. Then, the pasting substrate 20 pasted with the plurality of LED grains 101 is moved to a position above a target substrate 30, and an alignment is conducted such that the LED grains 101 are directly opposite to the positions on the target substrate 30 where the LED grains 101 are to be arranged. The pasting substrate 20 pasted with the plurality of LED grains 101 is heated to a first temperature to melt the hot melt adhesive film 201, such that the LED grains 101 are separated from the pasting substrate 20, and then the LED grains 101 are transferred to the target substrate 30. The pasting substrate 20 can simultaneously paste up a plurality of LED grains 101 so as to separate the plurality of LED grains 101 from the bearing substrate 100, and it can also simultaneously move the plurality of LED grains 101 to positions above the target substrate 30. In this way, after the pasting substrate 20 is heated, the hot melt adhesive film 201 will be melted, such that the plurality of LED grains 101 can be transferred to the target substrate 30 at the same time. With respect to the related art, the embodiments of the present disclosure can transfer a plurality of LED grains 101 at the same time, thereby reducing the difficulty of transferring a mass amount of LED grains 101.

For example, as the hot melt adhesive film 201 in the embodiments of the present disclosure will flow into the gaps between adjacent LED grains 101 to fill the height difference between the LED grains 101 and the target substrate 30 after the hot melt adhesive film 201 is melted, the height difference can be reduced or eliminated, thereby reducing the impact of the height difference on the displaying effect, luminous efficiency and the like.

Figure 9:
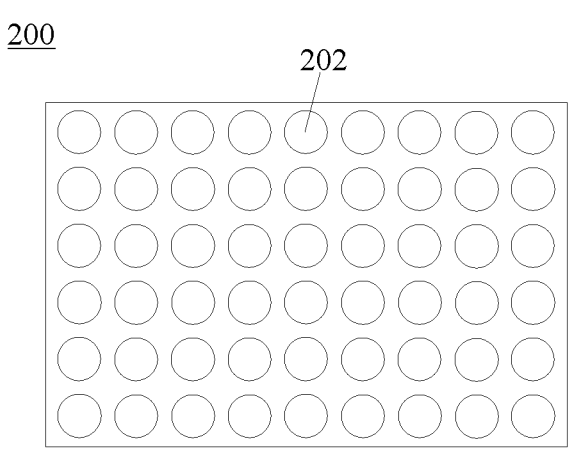
FIG. 9 is a structural diagram of a bottom plate provided by an embodiment of the present disclosure.
Figure 10:
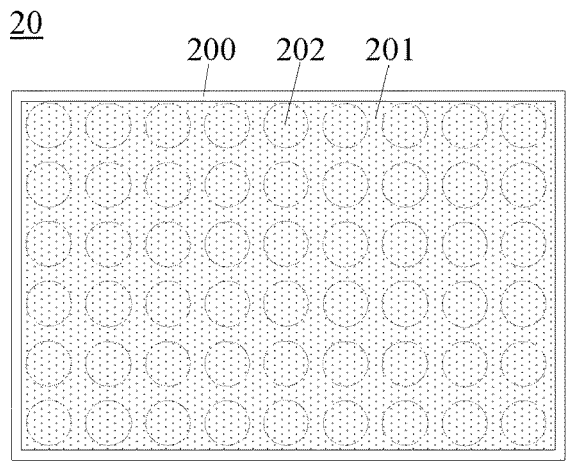
FIG. 10 is a structural diagram of a pasting substrate provided by another embodiment of the present disclosure.

In some embodiments, as shown in FIG. 9, the bottom plate 200 includes a plurality of through-holes 202, and as shown in FIG. 10, the through-holes 202 are covered by the hot melt adhesive film 201.

In the embodiments of the present disclosure, the shape of the through-hole 202 is not defined. As an example, the through-hole 202 may be in the shape of a circle, an oval, a rectangle, etc.

For example, the arrangement manner and spaced distance of the plurality of through-holes 202 in the bottom plate 200 may be set based on the arrangement manner and spaced distance of the plurality of LED grains 101 on the bearing substrate 100.

Moving the pasting substrate 20 to a position above the donor substrate 10, moving the pasting substrate 20 in a direction approaching the donor substrate 10 and pasting up the LED grains 101 on the bearing substrate 100 by the pasting substrate 20 include the following steps.

Figure 11A:
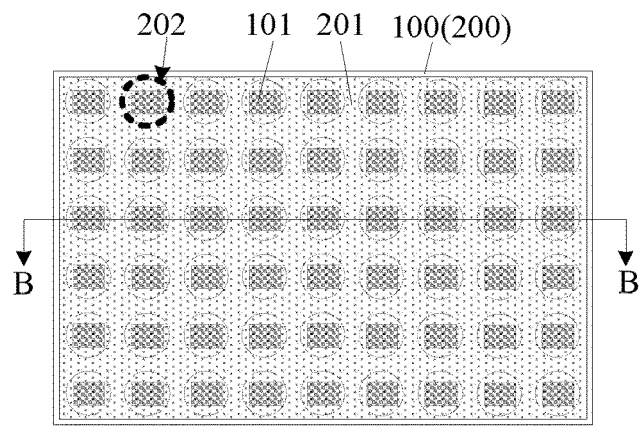
FIG. 11A is a structural diagram illustrating that through-holes in a bottom plate are directly opposite to LED grains, according to an embodiment of the present disclosure.
Figure 11B:
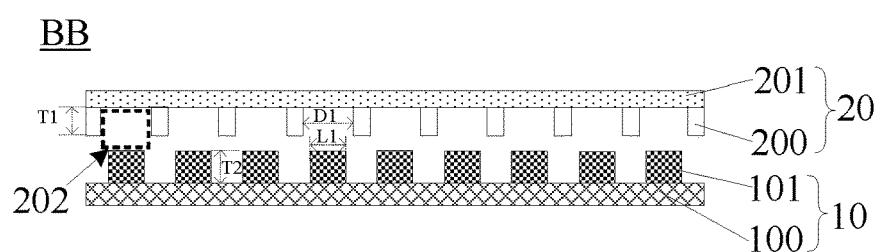
FIG. 11B is a cross-sectional view of FIG. 11A taken along line BB.
Figure 11C:
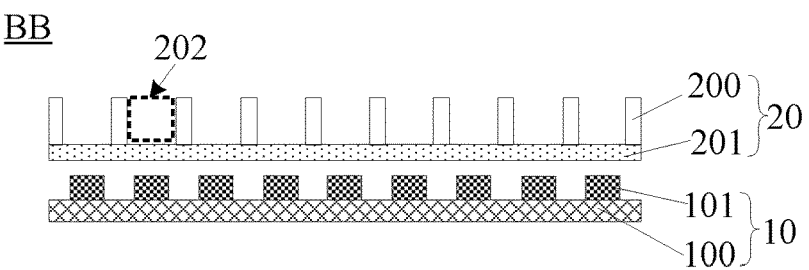
FIG. 11C is a cross-sectional view of FIG. 11A taken along line BB.

As shown in FIGS. 11*a*, 11*b* and 11*c*, the pasting substrate 20 is moved to a position above the donor substrate 10, and an alignment is conducted such that one LED grain 101 is directly opposite to one through-hole 202 in the bottom plate 200; then the pasting substrate 20 is moved in a direction approaching the donor substrate 10, and the LED grains 101 on the bearing substrate 100 are pasted up by the pasting substrate 20.

In some embodiments, as shown in FIG. 11*b*, the through-hole 202 is larger in size than the LED grain 101. As shown in FIG. 11*b*, the size D1 of the through-hole 202 in the direction parallel to the bearing substrate 100 is larger than the size L1 of the LED grain 101 in the direction parallel to the bearing substrate 100. On one hand, this facilitates the pasting of the LED grains 101; on the other hand, this also facilitates the formation of gaps between the LED grains 101 and the bottom plate 200, thereby facilitating the flowing of the hot melt adhesive film 201 between adjacent LED grains 101 after the hot melt adhesive film 201 is melted. For example, the size D1 of the through-hole 202 in the direction parallel to the bearing substrate 100 may be the diameter of the through-hole 202. In some other embodiments, the through-hole 202 may be smaller in size than the LED grain 101.

For example, the bottom plate 200 may be closer to the LED grains 101 than the hot melt adhesive film 201 when the LED grains 101 on the bearing substrate 100 are pasted up by the pasting substrate 20, as shown in FIG. 11*b*. Alternatively, the hot melt adhesive film 201 may be closer to the LED grains 101 than the bottom plate 200, as shown in FIG. 11*c*. In the case where the through-hole 202 is smaller in size than the LED grain 101, in order to ensure that the LED grains 101 on the bearing substrate 100 can be pasted up by the pasting substrate 20, the hot melt adhesive film 201 is closer to the LED grains 101 than the bottom plate 200 when the LED grains 101 on the bearing substrate 100 are pasted up by the pasting substrate 20.

For example, as shown in FIG. 11*b*, in order to facilitate the pasting of the LED grains and the hot melt adhesive film 201, the size T1 of the bottom plate 200 in the direction perpendicular to the bearing substrate 100 is smaller than the size T2 of the LED grain in the direction perpendicular to the bearing substrate 100.

Figure 11D:
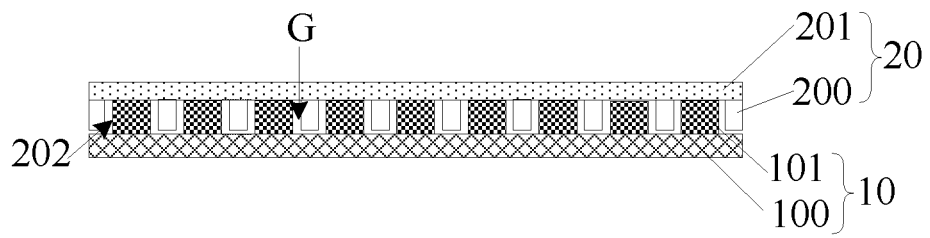
FIG. 11D is a schematic diagram illustrating pasting the LED grains in FIG. 11B onto a hot melt adhesive film.

For example, as shown in FIG. 11*d*, in the case where the LED grains 101 are pasted on the hot melt adhesive film 201, gaps G are formed between the LED grains 101 and the portions of the bottom plate that are located between adjacent LED grains 101, so as to facilitate the flowing of the melted hot melt adhesive film 201 between adjacent LED grains 101.

For example, one LED grain 101 is directly opposite to one through-hole 202 in the bottom plate 200. This means that the center of one LED grain 101 is directly opposite to the center of one through-hole 202.

In the embodiments of the present disclosure, as the bottom plate 200 includes a plurality of through-holes 202, the alignment between the pasting substrate 20 and the donor substrate 10 facilitates the accurate and rapid alignment between the LED grains 101 in the donor substrate 10 and the through-holes 202 in the bottom plate 200. For example, as the bottom plate 200 includes the through-holes 202, the hot melt adhesive film 201 may be flowing into and filled between adjacent LED grains 101 from the gaps of the through-holes 202 after melting, thereby reducing or eliminating the height difference between the LED grains 101 and the target substrate 30.

In some embodiments, as shown in FIG. 11*b*, the through-hole 202 is larger in size than the LED grain 101. Moving the pasting substrate 20 to a position above the donor substrate 10 includes: moving the pasting substrate 20 to a position above the donor substrate 10 in such a manner that the bottom plate 200 is closer to the LED grains 101 than the hot melt adhesive film 201.

In the embodiments of the present disclosure, when the pasting substrate 20 is moved to a position above the donor substrate 10 so as to align the LED grains 101 with the through-holes 202, the case that the bottom plate 200 is closer to the LED grains 101 than the hot melt adhesive film 201 facilitates the alignment between the through-holes 202 and the LED grains 101. Moreover, during alignment, this may prevent the hot melt adhesive film 201 from pasting up the LED grains 101 when the through-holes 202 and the LED grains 101 are not aligned accurately.

Figure 12:
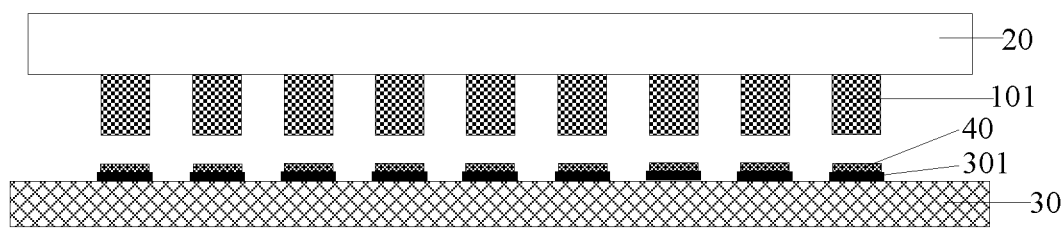
FIG. 12 is a structural diagram illustrating that a pasting substrate pasted with LED grains is directly opposite to a target substrate, according to another embodiment of the present disclosure.

In some embodiments, as shown in FIG. 12, electrically conductive adhesives 40 are arranged at the positions on the target substrate 30 where the LED grains 101 are to be arranged.

Figure 13:
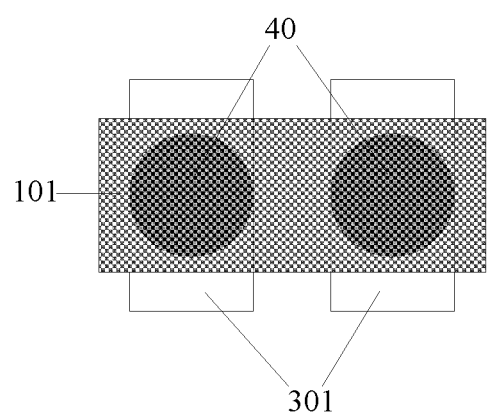
FIG. 13 is a structural diagram illustrating a connection of LED grains to electrically conductive adhesives, according to an embodiment of the present disclosure.

For example, as shown in FIGS. 12 and 13, the electrically conductive adhesives 40 are in contact with driving electrodes 301 on the target substrate 30.

In the embodiments of the present disclosure, the electrically conductive adhesive 40 is not defined, as long as it possesses electric conductivity and viscosity. For example, the electrically conductive adhesive 40 is tin paste but is not limited thereto.

For example, the electrically conductive adhesives 40 may be printed, by a printing process, at the positions on the target substrate 30 where the LED grains 101 are to be arranged.

In the case where the electrically conductive adhesives 40 are arranged at the positions on the target substrate 30 where the LED grains 101 are to be arranged, after Step S103 but before Step S104, the above-mentioned micro-LED transfer method also includes the following steps.

As shown in FIG. 12, the pasting substrate 20 pasted with a plurality of LED grains 101 is pressed against the target substrate 30 so as to connect the electrodes of the LED grains 101 to the electrically conductive adhesives 40 on the target substrate, as shown in FIG. 13. For example, as shown in FIG. 13, the first electrode and the second electrode of each LED grain 101 are respectively connected to the driving electrodes 301 through the electrically conductive adhesives 40, and different signals are respectively input to the two driving electrodes 301 so as to drive the LED grains 101 to emit light.

In the embodiments of the present disclosure, the electrically conductive adhesives 40 are arranged at the positions on the target substrate 30 where the LED grains 101 are to be arranged, and the driving electrodes 301 are in contact with the electrically conductive adhesives 40. After the pasting substrate 20 pasted with a plurality of LED grains 101 is pressed against the target substrate 30, the electrodes of the LED grains 101 are connected to the electrically conductive adhesives 40 on the target substrate 30, and hence are firmly connected to the driving electrodes 301 on the target substrate 30. As such, the LED grains 101 and the target substrate 30 can be prevented from moving relative to each other after the LED grains 101 are transferred to the target substrate 30, and the LED grains 101 can be prevented from deviating from the positions where the LED grains 101 are to be arranged.

In some embodiments, after Step S104, the above-mentioned micro-LED transfer method also includes: heating the target substrate 30 to a second temperature. The second temperature is greater than or equal to the melting temperature of the electrically conductive adhesive 40.

For example, the target substrate 30 may be placed into a heating furnace to be heated to the second temperature.

In the embodiments of the present disclosure, after the LED grains 101 are transferred to the target substrate 30, the target substrate 30 is heated to the second temperature. As the second temperature is greater than or equal to the melting temperature of the electrically conductive adhesives 40, the electrically conductive adhesives 40 will be melted. As such, the electrically conductive adhesives 40 will be in thorough contact with the electrodes of the LED grains 101, such that the welding strength is improved, and the LED grains 101 and the target substrate 30 are firmly fixed together. For example, after the target substrate 30 is heated to the second temperature, the hot melt adhesive that is flowing into and filled between adjacent LED grains 101 will be fully melted, thereby improving the flatness of the hot melt adhesive filled between adjacent LED grains 101.

In some embodiments, after the target substrate 30 is heated to the second temperature, the above-mentioned micro-LED transfer method also includes: cooling the target substrate 30 so as to solidify the hot melt adhesive flowing between adjacent LED grains 101.

For example, when the target substrate 30 is cooled, the lowered temperature should be smaller than or equal to the solidification temperature of the hot melt adhesive, such that the hot melt adhesive flowing between adjacent LED grains 101 can be solidified.

In the embodiments of the present disclosure, cooling the target substrate 30 may accelerate the solidification of the hot melt adhesive flowing between adjacent LED grains 101.

Figure 14:
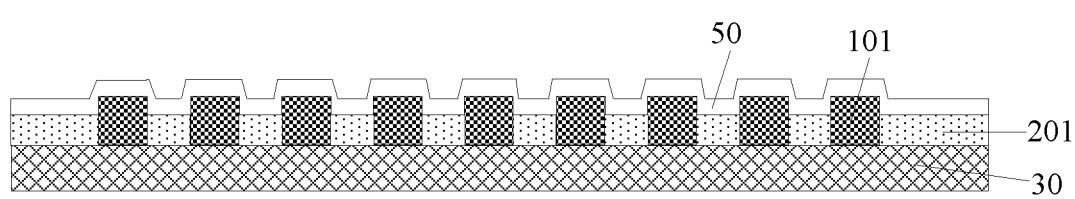
FIG. 14 is a structural diagram illustrating a formation of a protective film on LED grains, according to an embodiment of the present disclosure.

In some embodiments, as shown in FIG. 14, after Step S104, the above-mentioned micro-LED transfer method also includes: forming a transparent protective film 50 on sides of the LED grains 101 that are away from the target substrate 30.

In the embodiments of the present disclosure, the thickness of the protective film 50 is not defined. Considering that the displaying effect, luminous efficiency and other parameters will be affected if the thickness of the protective film 50 is too large, the thickness of the protective film 50 is optionally less than 0.1 mm.

In the embodiments of the present disclosure, a transparent protective film 50 is formed on sides of the LED grains 101 that are away from the target substrate 30. The protective film 50 can protect the LED grains 101 and prevent the LED grains 101 from being damaged.

The embodiments of the present disclosure do not define the method adopted to form the transparent protective film 50 on sides of the LED grains 101 that are away from the target substrate 30. In some embodiments, an atomization spraying process is utilized to form a transparent protective film 50 on sides of the LED grains 101 that are away from the target substrate 30. In some other embodiments, a coating process is utilized to form a transparent protective film 50 on sides of the LED grains 101 that are away from the target substrate 30.

In the embodiments of the present disclosure, the protective film 50 formed on sides of the LED grains 101 that are away from the target substrate 30 by the atomization spraying process has a relatively small thickness, and the thickness of the protective film 50 is relatively uniform.

For example, the existence of the height difference between the LED grains 101 and the target substrate 30 will affect the formation of the protective film 50, especially the formation of the protective film 50 having a relatively small thickness. However, in the embodiments of the present disclosure, the hot melt adhesive film 201 will flow between adjacent LED grains 101 after melted so as to reduce or eliminate the height difference, which facilitates the manufacturing of the protective film 50 having a relatively small thickness and good flatness, thereby improving the luminous efficiency of the LED grains 101.

As shown in FIG. 14, the embodiments of the present disclosure also provide a display panel. The display panel includes a target substrate 30 and a plurality of micro-LED grains 101 arranged on the target substrate 30. A hot melt adhesive film 201 is filled between adjacent micro-LED grains 101 so as to reduce or eliminate the height difference, thereby reducing or eliminating the impact of the height difference on displaying effect, luminous efficiency and the like. The material of the hot melt adhesive film 201 is an insulative material.

As shown in FIG. 14, the size of the protective film 50 in the direction perpendicular to the target substrate 30 is smaller than the size of the hot melt adhesive film 201 in the direction perpendicular to the target substrate 30. The hot melt adhesive film 201 shown in FIG. 14 is a hot melt adhesive film which undergoes the change from a solid state to a liquid state and then the change from a liquid state to a solid state.

As shown in FIG. 14, the size of the LED grain 101 in the direction perpendicular to the target substrate 30 is greater than the size of the hot melt adhesive film 201 in the direction perpendicular to the target substrate 30. In some other embodiments, the size of the LED grain 101 in the direction perpendicular to the target substrate 30 may be equal to the size of the hot melt adhesive film 201 in the direction perpendicular to the target substrate 30.

As shown in FIG. 14, in order to reduce the height difference to the greatest extent, the size of the hot melt adhesive film 201 in the direction perpendicular to the target substrate 30 is greater than half of the size of the LED grain 101 in the direction perpendicular to the target substrate 30. As a further example, the size of the hot melt adhesive film 201 in the direction perpendicular to the target substrate 30 is greater than or equal to two-thirds of the size of the LED grain 101 in the direction perpendicular to the target substrate 30.

For example, a size of a component in the direction perpendicular to the target substrate 30 may be the thickness of the component.

As shown in FIG. 14, the LED grains 101 are in contact with the hot melt adhesive film 201, the LED grains 101 are in contact with the protective film 50, and the protective film 50 is in contact with both of the LED grains 101 and the hot melt adhesive film 201.

For example, in the embodiments of the present disclosure, the hot melt adhesive film 201 is a styrene-propylene copolymer, a cycloolefin copolymer, a cycloolefin polymer or polystyrene, but is not limited thereto. For example, the optical transmittance of the hot melt adhesive film is greater than or equal to 90%, but is not limited thereto.

For example, in the embodiments of the present disclosure, the bottom plate 200 may be made of plastic, but is not limited thereto. The protective film may be made of a transparent insulating material, e.g., silicon oxide, silicon nitride or silicon oxynitride, but is not limited thereto.

The embodiments of the present disclosure provide a micro-LED transfer method, which provides a donor substrate and a pasting substrate. The donor substrate includes a bearing substrate and a plurality of LED grains arranged on the bearing substrate in an array, and the pasting substrate includes a bottom plate and a hot melt adhesive film arranged on the bottom plate. The pasting substrate is moved to a position above the donor substrate, and the pasting substrate is moved in a direction approaching the donor substrate; the LED grains on the bearing substrate are pasted up by the pasting substrate so as to separate the LED grains from the bearing substrate. Then the pasting substrate pasted with a plurality of LED grains is moved to a position above a target substrate, and an alignment is conducted such that the LED grains are directly opposite to the positions on the target substrate where the LED grains are to be arranged. The pasting substrate pasted with a plurality of LED grains is heated to a first temperature to melt the hot melt adhesive film, such that the LED grains are separated from the pasting substrate, and then the LED grains are transferred to the target substrate. The pasting substrate can simultaneously paste up a plurality of LED grains so as to separate the plurality of LED grains from the bearing substrate, and it can also simultaneously move the plurality of LED grains to positions above the target substrate. As such, after the pasting substrate is heated, the hot melt adhesive film will be melted, such that the plurality of LED grains can be transferred to the target substrate at the same time. As compared with the related art, the embodiments of the present disclosure can transfer a plurality of LED grains at the same time, thereby reducing the difficulty of transferring a mass amount of LED grains.

For example, as the hot melt adhesive film in the embodiments of the present disclosure will flow into the gaps between adjacent LED grains to fill the height difference between the LED grains and the target substrate after it is melted, the height difference can be reduced or eliminated, thereby reducing or eliminating the impact of the height difference on displaying effect, luminous efficiency and the like.

Although the present disclosure has been described in details with general description and specific embodiments, it is obvious to those skilled in the art that some modifications or improvements can be made based on the embodiments of the present disclosure. Therefore, these modifications or improvements made without departing from the spirit of the present disclosure belong to the scope of protection sought to be protected by the present disclosure.

What is claimed is:

1. A micro-light-emitting diode (micro-LED) transfer method, comprising:
   providing a donor substrate, the donor substrate comprising a bearing substrate and a plurality of LED grains arranged on the bearing substrate in an array;
   providing a pasting substrate, the pasting substrate comprising a bottom plate and a hot melt adhesive film arranged on the bottom plate;
   moving the pasting substrate to a position above the donor substrate, and moving the pasting substrate in a direction approaching the donor substrate to paste up the plurality of LED grains arranged on the bearing substrate by using the pasting substrate, so that the plurality of LED grains are separated from the bearing substrate;
   moving the pasting substrate pasted with the plurality of LED grains to a position above a target substrate in such a manner that the plurality of LED grains are closer to the target substrate than the pasting substrate is to the target substrate, and conducting an alignment so that the plurality of LED grains are directly opposite to positions on the target substrate where the plurality of LED grains are to be arranged, respectively; and
   heating the pasting substrate pasted with the plurality of LED grains to a first temperature to melt the hot melt adhesive film, so that the plurality of LED grains and the hot melt adhesive film are separated from the pasting substrate and then are transferred to the target substrate,
   the first temperature being greater than or equal to a melting temperature of the hot melt adhesive film,
   wherein electrically conductive adhesives are arranged at positions on the target substrate where the plurality of LED grains are to be arranged, and
   wherein after the plurality of LED grains are transferred to the target substrate, the micro-LED transfer method further comprises:
   heating the target substrate to a second temperature, the second temperature being greater than or equal to a melting temperature of the electrically conductive adhesives.

2. The micro-LED transfer method according to claim 1, wherein the bottom plate comprises a plurality of through-holes covered by the hot melt adhesive film.

3. The micro-LED transfer method according to claim 2, wherein moving the pasting substrate to the position above the donor substrate, and moving the pasting substrate in the direction approaching the donor substrate to paste up the plurality of LED grains arranged on the bearing substrate by using the pasting substrate comprises:
   moving the pasting substrate to the position above the donor substrate, conducting an alignment so that the plurality of LED grains are directly opposite to the plurality of through-holes in the bottom plate, respectively, and moving the pasting substrate in the direction approaching the donor substrate to paste up the plurality of LED grains arranged on the bearing substrate by using the pasting substrate.

4. The micro-LED transfer method according to claim 3, wherein a size of each of the plurality of through-holes in a direction parallel to the bearing substrate is greater than a size of each of the plurality of LED grains in the direction parallel to the bearing substrate.

5. The micro-LED transfer method according to claim 4, wherein moving the pasting substrate to the position above the donor substrate comprises:

moving the pasting substrate to the position above the donor substrate in such a manner that the bottom plate is closer to the plurality of LED grains than the hot melt adhesive film.

6. The micro-LED transfer method according to claim 5, wherein a thickness of the bottom plate in a direction perpendicular to the bearing substrate is smaller than a thickness of each of the plurality of LED grains in the direction perpendicular to the bearing substrate.

7. The micro-LED transfer method according to claim 1, wherein after the plurality of LED grains are directly opposite to the positions on the target substrate where the plurality of LED grains are to be arranged, and before the pasting substrate pasted with the plurality of LED grains is heated to the first temperature, the micro-LED transfer method further comprises:

pressing the pasting substrate pasted with the plurality of LED grains against the target substrate so as to connect electrodes of the plurality of LED grains to the electrically conductive adhesives on the target substrate, respectively.

8. The micro-LED transfer method according to claim 1, wherein the target substrate is a circuit substrate.

9. The micro-LED transfer method according to claim 1, wherein the second temperature is greater than the first temperature.

10. The micro-LED transfer method according to claim 7, wherein the electrically conductive adhesives comprise tin pastes.

11. The micro-LED transfer method according to claim 1, wherein after heating the target substrate to the second temperature, the micro-LED transfer method further comprises:

cooling the target substrate so as to solidify the hot melt adhesive film flowing between adjacent LED grains.

12. The micro-LED transfer method according to claim 1, wherein after the plurality of LED grains are transferred to the target substrate, the micro-LED transfer method further comprises:

forming a transparent protective film on sides of the plurality of LED grains that are away from the target substrate.

13. The micro-LED transfer method according to claim 12, wherein forming the transparent protective film on the sides of the plurality of LED grains that are away from the target substrate comprises:

forming the transparent protective film on the sides of the plurality of LED grains that are away from the target substrate by using an atomization spraying process.

14. The micro-LED transfer method according to claim 12, wherein a size of the transparent protective film in a direction perpendicular to the target substrate is smaller than a size of the hot melt adhesive film in the direction perpendicular to the target substrate.

15. The micro-LED transfer method according to claim 12, wherein a size of each of the plurality of LED grains in a direction perpendicular to the target substrate is greater than or equal to a size of the hot melt adhesive film in the direction perpendicular to the target substrate.

16. The micro-LED transfer method according to claim 1, wherein the hot melt adhesive film is an insulating material film.

* * * * *